United States Patent [19]
Lee

[11] Patent Number: 5,872,399
[45] Date of Patent: Feb. 16, 1999

[54] SOLDER BALL LAND METAL STRUCTURE OF BALL GRID SEMICONDUCTOR PACKAGE

[75] Inventor: Moo Eung Lee, Seoul, Rep. of Korea

[73] Assignees: ANAM Semiconductor, Inc., Seoul, Rep. of Korea; Amkor Technology, Inc., Chandler, Ariz.

[21] Appl. No.: 825,945

[22] Filed: Apr. 1, 1997

[30]    Foreign Application Priority Data

Apr. 1, 1996 [KR] Rep. of Korea ............... 1996-9778

[51] Int. Cl.$^6$ ................. H01L 23/48; H01L 23/52; H01L 29/40
[52] U.S. Cl. ............ 257/738; 257/737; 257/741; 257/668; 438/613
[58] Field of Search ..................... 257/668, 737, 257/738, 741; 438/613, 614

[56]    References Cited

U.S. PATENT DOCUMENTS

| | | | |
|---|---|---|---|
| 5,504,277 | 4/1996 | Danner | 174/261 |
| 5,521,435 | 5/1996 | Mizukoshi | 257/698 |
| 5,557,844 | 9/1996 | Bhatt et al. | 29/852 |
| 5,668,405 | 9/1997 | Yamashita | 257/668 |
| 5,669,783 | 9/1997 | Inoue et al. | 439/331 |

FOREIGN PATENT DOCUMENTS

| | | | |
|---|---|---|---|
| 62-35650 | 2/1987 | Japan | 257/738 |

*Primary Examiner*—Mahshid D. Saadat
*Assistant Examiner*—Allan R. Wilson
*Attorney, Agent, or Firm*—Skjerven Morrill MacPherson Franklin & Friel LLP; Thomas S. MacDonald

[57]    ABSTRACT

A solder ball land metal structure of a ball grid array semiconductor package capable of obtaining a maximum contact area between a solder ball land metal element and a solder ball fused on the land metal element. A solder mask defined type land metal structure according to the present invention has a single etching hole at the central portion thereof or a plurality of etching holes at the outer portion thereof in order to obtain an increased contact area for a solder ball. Each etching hole extends from the upper surface of the land metal element to the upper surface of the BT substrate throughout the land metal element or extends from the upper surface of the land metal element to a depth corresponding to about half the thickness of the land metal element. Each etching hole serves as a locking hole for fixing the fused solder ball. Thus, it is effectively prevent the solder ball from being separated from the land metal element. A non-solder mask defined type land metal structure according to the present invention has a plurality of tooth-shaped radial extensions provided at a land metal element having a conventional structure. The extension are interposed between a BT substrate and a solder mask. By such a configuration, it is effectively prevent the solder ball and land metal element from being separated from the BT substrate.

8 Claims, 5 Drawing Sheets

SOLDER BALL LAND METAL STRUCTURE OF BALL GRID SEMICONDUCTOR PACKAGE

BACKGROUND OF THE INVENTION

1. Field of the Invention

The present invention relates to a solder ball land metal structure of ball grid array semiconductor packages, and more particularly to a solder ball land metal structure which is configured to have etching holes or a tooth-shaped portion, thereby obtaining a maximum contact area between a solder ball land metal element (hereinafter, simply referred to as "land metal element") and a solder ball fused on the land metal element to prevent the solder ball from being separated from the land metal element.

2. Description of the Prior Art

In accordance with high integration techniques associated with semiconductor chips, an increased number of circuits can be integrated on a semiconductor chip having a limited size. Such a semiconductor chip has an increased number of input/output signals. In order to use such a semiconductor chip, a ball grid array (BGA) semiconductor package has been developed which has an increased number of input/output pins at an increased mounting density. Such a BGA semiconductor package is provided with solder balls which are fused on one surface of the semiconductor package. The solder balls serve as input/output terminals. By virtue of the use of such solder balls, it is possible to accept an increased number of input/output signals as compared to conventional semiconductor packages. In particular, the BGA semiconductor package has a chip size not so large as compared to conventional packages. In this regard, the BGA semiconductor package has been highlighted as a next generation semiconductor package.

Now, a general configuration of such a BGA semiconductor package and a fused structure of its solder balls will be described in conjunction with FIGS. 1, 2A and 2B.

Referring to FIG. 1, a general configuration of a BGA semiconductor package is illustrated. As shown in FIG. 1, the BGA semiconductor package includes a semiconductor chip 400 which is centrally bonded to the upper surface of a substrate 300 made of bismaleimide triazine epoxy resin (hereinafter, such a substrate is referred to as "BT substrate") by means of an epoxy layer 500. The semiconductor chip 400 has input/output pads 410 connected to metal traces 140 formed on the outer portion of the upper surface of the BT substrate 300 by means of wires 600. A solder mask 200 is formed on the metal traces 140 to protect a circuit pattern configured by the metal traces 140. Such metal traces 140 and solder mask 200 are also laminated on the lower surface of the BT substrate 300. A plurality of land metal elements. 100 are formed on the lower surface of the BT substrate 300. The land metal elements 100 are connected to the metal traces 140, respectively. Solder balls 150 are fused on the land metal elements, respectively. The solder mask 200 disposed at the lower surface of the BT substrate 300 is provided with recesses for receiving the metal traces 140 and land metal elements 100, respectively, in order to protect a circuit pattern configured by the metal traces 140. Although not shown, each metal trace 140 disposed at the upper surface of the BT substrate 300 is connected with each associated metal trace 140 disposed at the lower surface of the BT substrate 300. In order to protect the semiconductor chip 400 and wires 600 from the environment, a seal 700 is molded on the upper surface of the BT substrate 300. Thus, an one-side molding structure is obtained.

In such a BGA semiconductor package, regions, on which solder balls are fused, are called "land metal elements". Such land metal elements are mainly classified into those of a solder mask defined (SMD) type and those of a non-solder mask defined (NSMD) type respectively shown in FIGS. 2A and 2C. Conventional fused structures of solder balls on land metal elements will be described in conjunction with FIGS. 2A and 2C.

FIG. 2A is a plan view illustrating an SMD type land metal element in a state prior to the fusing of a solder ball. As shown in FIG. 2A, a solder mask 200 covers a metal trace 140 and the outer edge portion of a land metal element 100 connected to the metal trace 140. This will be described in detail in conjunction with FIG. 2B which is a cross-sectional view taken along the line 2B—2B of FIG. 2A. The land metal element 100, which is made of copper, is formed on a BT substrate 300. A nickel (Ni) film 110 and a gold (Au) film 120 are sequentially plated on the land metal element 100. The land metal element 100 is disposed in such a manner that its outer edge portion is interposed between the BT substrate 300 and solder mask 200.

The land metal element 100 is subsequently processed in a furnace maintained at a high temperature so as to fuse a solder ball 150 on its plated surface. The reason why the plated surface is provided on the land metal element 100 is to allow the solder ball 150 to be easily fused on the land metal element 100. The gold film 120 plated on the land metal element 100 is melted along with the solder ball 150 during a fusing process, so that it is mixed with the melted solder ball 150. As a result, the solder ball 150 is fused on the nickel film 110.

On the other hand, FIG. 2C is a plan view illustrating an NSMD type land metal element in a state prior to the fusing of a solder ball. As shown in FIG. 2C, a solder mask 200 covers only a metal trace 140 so that a land metal element 100 connected to the metal trace 140 is completely exposed through an opening 210 of the solder mask 200. This will be described in detail in conjunction with FIG. 2D which is a cross-sectional view taken along the line 2D—2D of FIG. 2C. The land metal element 100 is formed on a BT substrate 300 inside the opening 210 of the solder mask 200. A nickel film 110 and a gold film 120 are sequentially plated on the land metal element 100. The land metal element 100 is subsequently processed in a furnace maintained at a high temperature so as to fuse a solder ball 150 on its plated surface. As in the structure of FIG. 2A, the solder ball 150 is melted along the gold film 120 plated on the land metal element 100 during a fusing process, so that it is mixed with the melted gold. As a result, the solder ball 150 is fused on the nickel film 110.

However, both the SMD and NSMD type land metal structures have problems which should be solved. Conventional techniques associated with land metal structures have been focused on the purpose for preventing solder balls fused on land metal elements from being subsequently separated from the land metal elements. Since solder balls in a BGA semiconductor package serve as a medium for exchanging input/output signals between a semiconductor chip and a mother board, the BGA semiconductor package completely loses its function when the solder balls are separated from the land metal elements. In other words, such a solder ball separation phenomenon considerably deteriorates the reliability of the BGA semiconductor package.

In order to reduce such a solder ball separation phenomenon while allowing a solder ball to be easily fused on a land metal element, conventional techniques involve a process for sequentially plating nickel and gold films on a smooth and flat surface of the land metal element. Although the plated films provide a mechanism capable of easily fusing the solder ball on the land metal element, they can not avoid the solder ball separation phenomenon.

In the case of the SMD land metal structure, solder balls are easily separated from land metal elements at a mixed layer between the solder ball and the nickel of the nickel-plated film. In the case of the NSMD type land metal structure, solder balls are easily separated from the BT substrate well as from the land metal elements.

SUMMARY OF THE INVENTION

Therefore, an object of the invention is to solve the above-mentioned problems and to provide an improved land metal structure capable of maximizing the bonding area between a land metal element and a solder ball, thereby preventing the solder ball from being separated from the land metal element.

In accordance with the present invention, this object is accomplished by providing a ball grid array semiconductor package-comprising a semiconductor chip, a substrate made of bismaleimide triazine epoxy resin and bonded to a lower surface of the semiconductor chip by an adhesive, first metal traces formed on an outer portion of an upper surface of the substrate, a first solder mask formed on the first metal traces, wires adapted to connect input/output pads of the semiconductor chip to the first metal traces, respectively, second metal traces formed on a lower surface of the substrate, land metal elements formed on the lower surface of the substrate and connected to the second metal traces, respectively, solder balls fused on the land metal elements, respectively, and a second solder mask formed on the second metal traces, further comprising: hole means formed on an upper surface of each land metal element and adapted to increase a contact area between the land metal element and the associated solder ball, the hole means comprising at least one etching hole.

BRIEF DESCRIPTION OF THE DRAWINGS

Other objects and aspects of the invention will become apparent from the following description of embodiments with reference to the accompanying drawings in which:

FIGS. 4A to 5E are plan and cross-sectional views respectively illustrating various land metal structures used in a BGA semiconductor package in accordance with a third embodiment of the present invention.

DETAILED DESCRIPTION OF THE PREFERRED EMBODIMENTS

Figure 1:
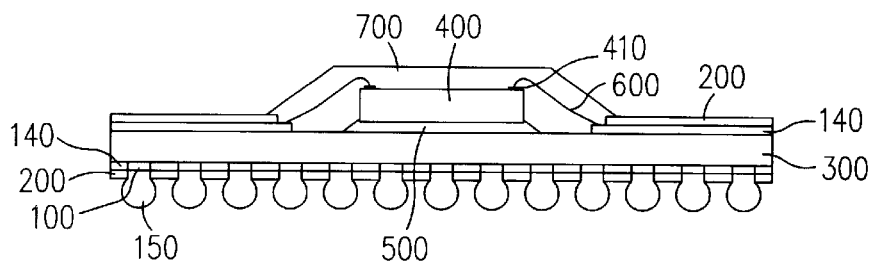
FIG. 1 is a cross-sectional view illustrating a general configuration of a BGA semiconductor package.
Figure 2A:
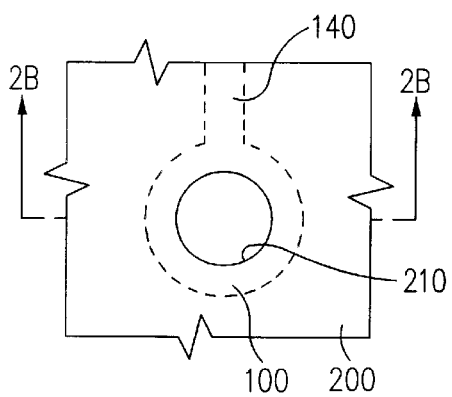
FIGS. 2A to 2D are plan and cross-sectional views respectively illustrating conventional land metal elements.
Figure 2B:
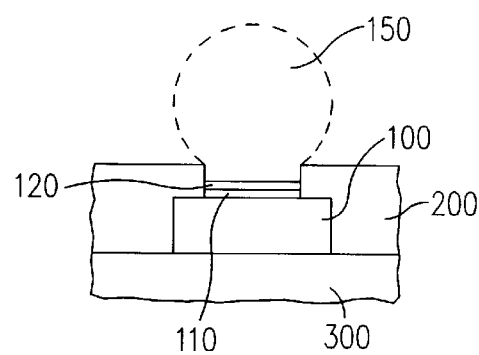
Figure 2C:
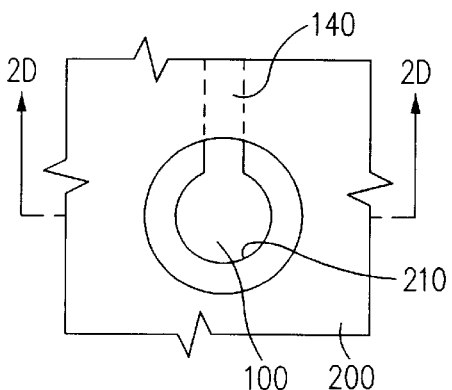
Figure 2D:
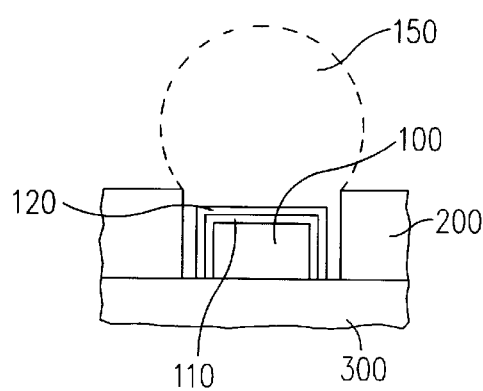

FIGS. 3A to 3E illustrate various land metal structures used in a BGA semiconductor package in accordance with a first embodiment of the present invention, respectively. In FIGS. 3A to 3E, elements respectively corresponding to those in FIGS. 2A to 2D are denoted by the same reference numerals.

In accordance with this embodiment, a single etching hole 160 is formed at the central surface portion of an SMD type land metal element 100 formed on a BT substrate 300.

Figure 3A:
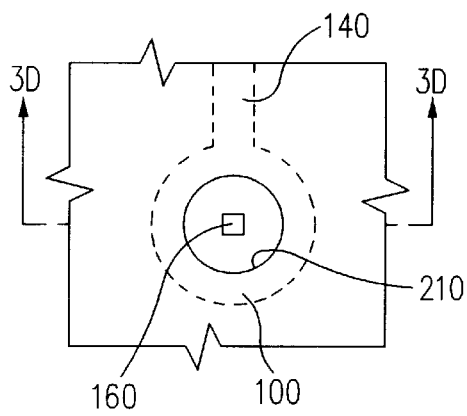
FIGS. 3A to 3E are plan and cross-sectional views respectively illustrating various land metal structures used in a BGA semiconductor package in accordance with a first embodiment of the present invention.
Figure 3B:
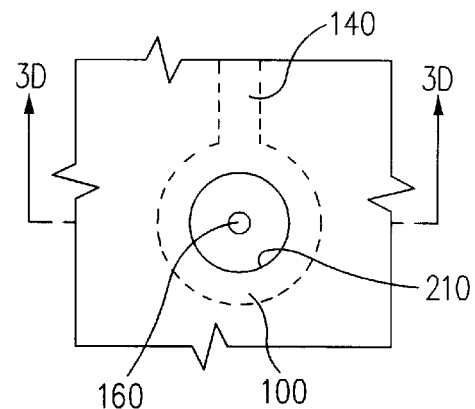
Figure 3C:
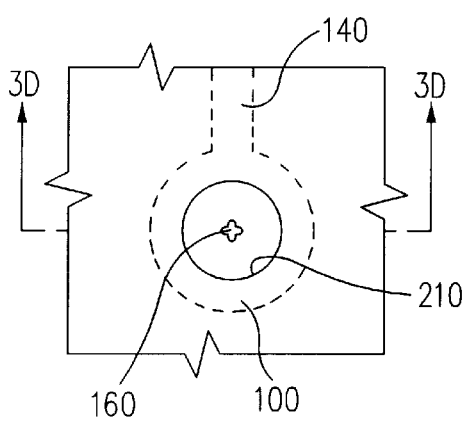
Figure 3D:
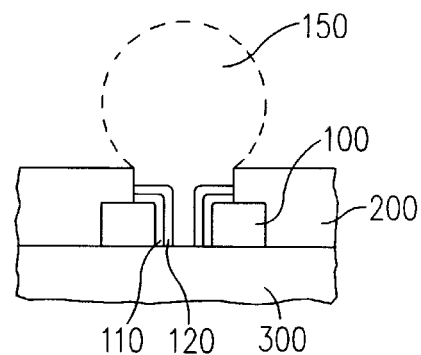
Figure 3E:
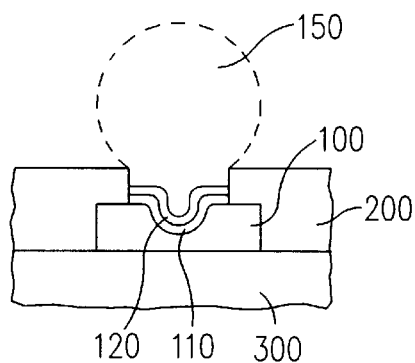

The etching hole 160 may have various shapes such as a rectangular shape, a circular shape and a cross shape as shown in FIGS. 3A to 3C. The etching hole 160 may extend from the upper surface of the land metal element 100 to the upper surface of the BT substrate 300 throughout the land metal element 100, as shown in FIG. 3D which is a cross-sectional view taken along the line 3D—3D of FIG. 3A, 3B or 3C. Alternatively, the etching hole 160 may extend from the upper surface of the land metal element 100 to a depth corresponding to about half the thickness of the land metal element 100, as shown in FIG. 3E which is a cross-sectional view taken along the line 3D—3D of FIG. 3A, 3B or 3C. After the formation of the etching hole 160, the land metal element 100 is plated with a nickel film 110 and a gold film 120 in a sequential manner. The etching hole 160 serves to increase the contact area between the land metal element 100 and a solder ball 150 to be fused on the land metal element 100. The etching hole 160 also serves as a locking hole for preventing the fused solder ball 150 from being separated from the land metal element 100.

FIGS. 4A to 4E illustrate various land metal structures used in a BGA semiconductor package in accordance with a second embodiment of the present invention, respectively. In FIGS. 4A to 4E, elements respectively corresponding to those in FIGS. 2A to 2D are denoted by the same reference numerals.

In accordance with this embodiment, a plurality of etching holes 160 are formed at the outer surface portion of an SMD type land metal element 100 formed on a BT substrate 300.

Figure 4A:
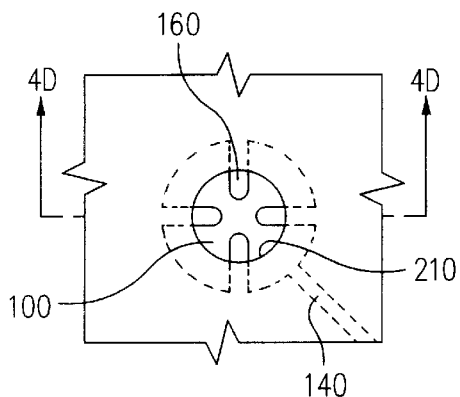
FIGS. 4A to 4E are plan and cross-sectional views respectively illustrating various land metal structures used in a BGA semiconductor package in accordance with a second embodiment of the present invention.
Figure 4B:
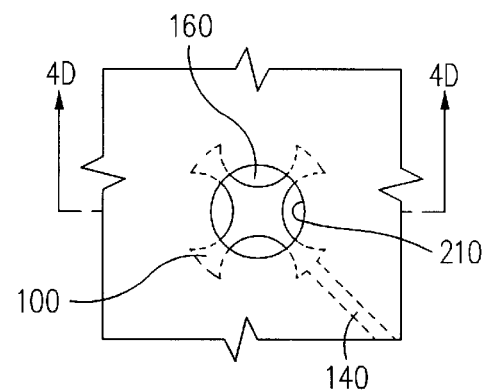
Figure 4C:
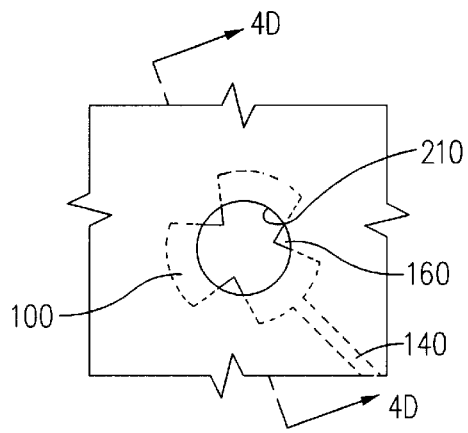
Figure 4D:
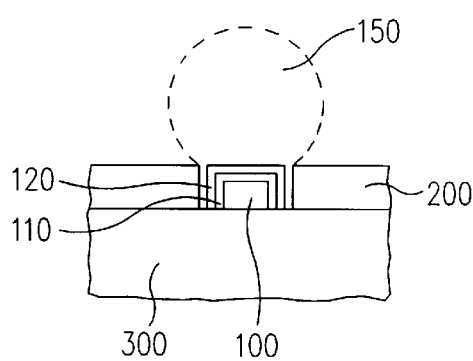
Figure 4E:
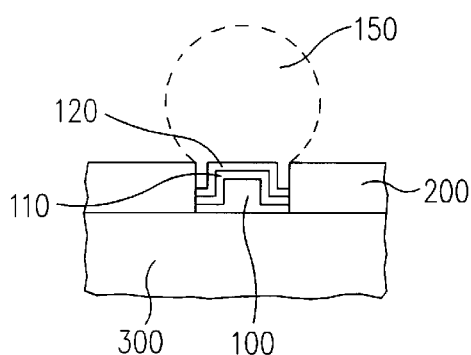

The etching holes 160 are arranged in a symmetrical manner to form a symmetrical shape. Each etching hole 160 may have various shapes such as a bar shape, a semilunar shape and a triangular shape as shown in FIGS. 4A to 4C. Each etching hole 160 may extend from the upper surface of the land metal element 100 to the upper surface of the BT substrate 300 throughout the land metal element 100, as shown in FIG. 4D which is a cross-sectional view taken along the line 4D—4D of FIG. 4A, 4B or 4C. Alternatively, each etching hole 160 may extend from the upper surface of the land metal element 100 to a depth corresponding to about half the thickness of the land metal element 100, as shown in FIG. 4E which is a cross-sectional view taken along the line 4D—4D of FIG. 4A, 4B or 4C. After the formation of the etching holes 160, the land metal element 100 is plated with a nickel film 110 and a gold film 120 in a sequential manner. Since the land metal structure of FIG. 4A, 4B or 4C has a plurality of etching holes 160 at its outer portion, it can provide an increased contact area between the land metal element 100 and solder ball 150, as compared to that of the first embodiment. In this case, each etching hole 160 also serves as a locking hole for preventing the fused solder ball 150 from being separated from the land metal element 100. Thus, it is possible to further reduce a solder ball separation phenomenon.

On the other hand, FIGS. 5A to 5E illustrate various land metal structures used in a BGA semiconductor package in accordance with a third embodiment of the present invention, respectively. In FIGS. 5A to 5E, elements respectively corresponding to those in FIGS. 2A to 2D are denoted by the same reference numerals.

Figure 5A:
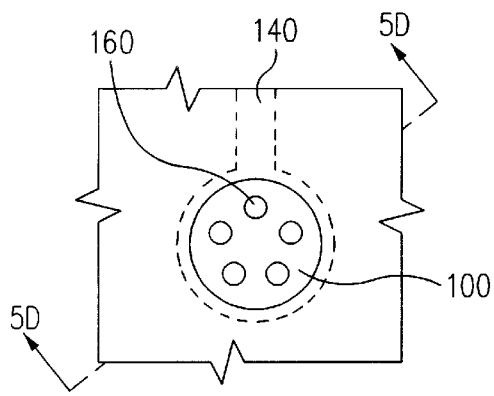
Figure 5B:
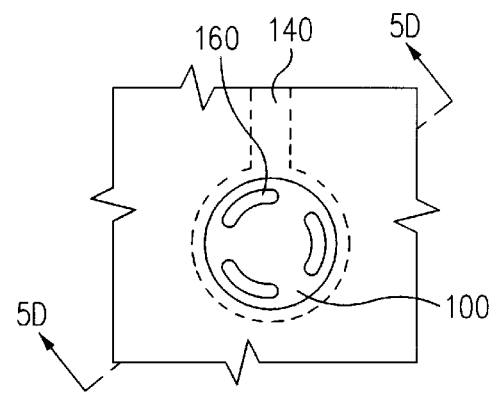
Figure 5C:
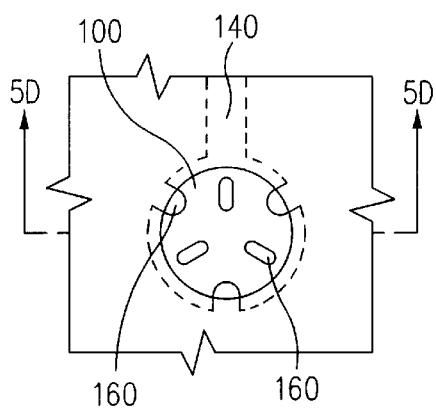
Figure 5D:
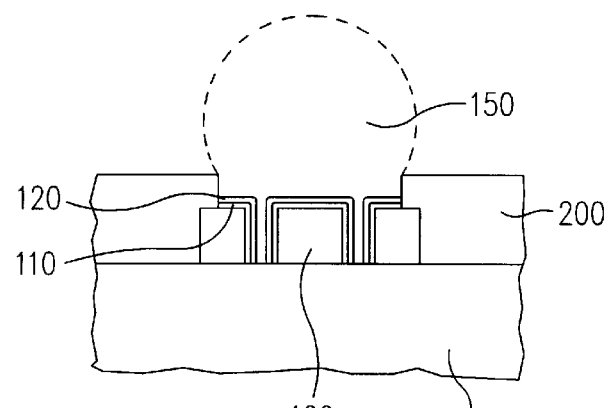
Figure 5E:
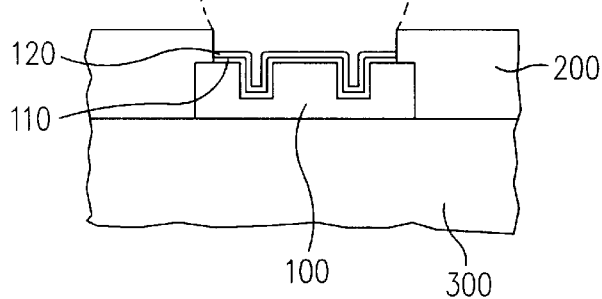

In accordance with this embodiment, a plurality of etching holes 160 are formed at the central and outer surface portions of an SMD type land metal element 100 formed on a BT substrate 300. Each etching hole 160 may extend from the upper surface of the land metal element 100 to the upper surface of the BT substrate 300 throughout the land metal element 100, as shown in FIG. 5D which is a cross-sectional view taken along the line 5D—5D of FIG. 5A, 5B or 5C. Alternatively, each etching hole 160 may extend from the upper surface of the land metal element 100 to a depth corresponding to about half the thickness of the land metal element 100, as shown in FIG. 5E which is a cross-sectional view taken along the line D-D' of FIG. 5A, 5B or 5C. After the formation of the etching holes 160, the land metal element 100 is plated with a nickel film 110 and a gold film 120 in a sequential manner. Since the land metal structure of FIG. 4A, 4B or 4C has a plurality of etching holes 160 at its central and outer portions, it can provide a maximum contact area between the land metal element 100 and solder ball 150. In this case, a plurality of locking holes are also provided by the etching holes 160. Accordingly, this embodiment is most preferable, as compared to the first and second embodiments.

Figure 6A:
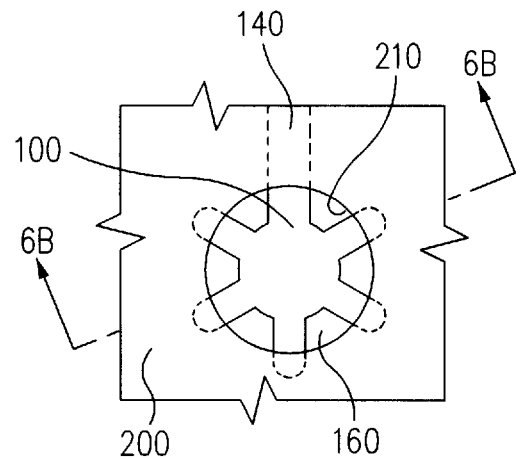
FIGS. 6A and 6B are plan and cross-sectional views respectively illustrating various land metal structures used in a BGA semiconductor package in accordance with a fourth embodiment of the present invention.
Figure 6B:
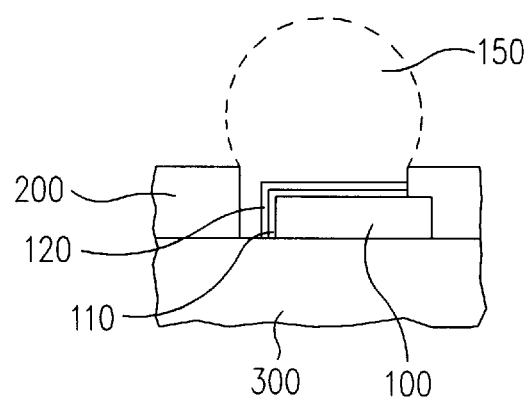

FIGS. 6A and 6B illustrate various NSMD type land metal structures used in a BGA semiconductor package in accordance with a fourth embodiment of the present invention, respectively. In FIGS. 6A and 6B, elements respectively corresponding to those in FIGS. 2A to 2D are denoted by the same reference numerals.

In accordance with this embodiment, a land metal element 100, which is disposed in an opening 210 provided at a solder mask 200, has a plurality of tooth-shaped radial extensions interposed between a BT substrate 300 and the solder mask 200, as shown in FIG. 6B which is a cross-sectional view taken along the line E-E' of FIG. 6A. Since the land metal element 100 of this embodiment provides an increased contact area between the land metal element 100 and solder ball 150 by virtue of the extensions, it is possible to completely prevent the solder ball 150 and land metal element 100 from being separated from the BT substrate 300.

As apparent from the above description, the SMD type land metal structure according to the present invention has a single etching hole at the central portion thereof or a plurality of etching holes at the outer portion thereof in order to obtain an increased contact area for a solder ball. In this case, each etching hole may have various shapes. Each etching hole may extend from the upper surface of the land metal element to the upper surface of the BT substrate throughout the land metal element or extend from the upper surface of the land metal element to a depth corresponding to about half the thickness of the land metal element. By such a configuration, each etching hole serves as a locking hole for fixing the fused solder ball. Thus, it is effectively prevent the solder ball from being separated from the land metal element. On the other hand, the NSMD type land metal structure according to the present invention has a plurality of tooth-shaped radial extensions provided at a land metal element having a conventional structure. The extension are interposed between a BT substrate and a solder mask. By such a configuration, it is effectively prevent the solder ball and land metal element from being separated from the BT substrate.

As the solder ball separation phenomenon is considerably reduced in accordance with the present invention, it is possible to greatly improve the reliability of a BGA semiconductor package in which solder balls are used as input/output terminals.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A ball grid array semiconductor package comprising a semiconductor chip, a substrate made of bismaleimide triazine epoxy resin and bonded to a lower surface of the semiconductor chip by an adhesive, first metal traces formed on an outer portion of an upper surface of the substrate, a first solder mask formed on the first metal traces, wires adapted to connect input/out pads of the semiconductor chip to the first metal traces, respectively, second metal traces formed on a lower surface of the substrate, land metal elements formed on the lower surface of the substrate and connected to the second metal traces, respectively, solder balls fused on the land metal elements, respectively, and a second solder mask formed on the second metal traces said second mask having an opening, further comprising:

a plurality of holes formed on an upper surface of each land metal element and adapted to increase a contact area between the land metal element and the associated solder ball; and further comprising a plurality of radial extensions outwardly extending from an outer peripheral edge of each land metal element, each extension extending between two of said plurality of holes and extending radically outwardly from an outer periphery of said second solder mask opening and interposed between the substrate and the second solder mask.

2. The ball grid array semiconductor package in accordance with claim 1, wherein the plurality of holes extend from the upper surface of each land metal element to the upper surface of the substrate throughout the land metal element.

3. The ball grid array semiconductor package in accordance with claim 1, wherein the plurality of holes extend from the upper surface of each land metal element to a depth corresponding to about half the thickness of the land metal element.

4. The ball grid array semiconductor package in accordance with claim 1, wherein the plurality of holes are formed at an outer surface portion of each land metal element and each hole has a bar, semilunar or triangular shape.

5. A ball grid array semiconductor package comprising a semiconductor chip, a substrate made of bismaleimide triazine epoxy resin and bonded to a lower surface of the semiconductor chip by an adhesive, first metal traces formed on an outer portion of an upper surface of the substrate, a first solder mask formed on the first metal traces, wires adapted to connect input/out pads of the semiconductor chip to the first metal traces, respectively, second metal traces formed on a lower surface of the substrate, land metal elements formed on the lower surface of the substrate and connected to the second metal traces, respectively, solder balls fused on the land metal elements, respectively, and a second solder mask formed on the second metal traces, further comprising a plurality of holes formed on an upper surface of each land metal element and adapted to increase a contact area between the land metal element and the associated solder ball; and further comprising a plurality of tooth-shaped radial extensions outwardly extending from an outer peripheral edge of each land metal element, each extension being interposed between the substrate and the second solder mask.

6. The ball grid array semiconductor package in accordance with claim 5 wherein each hole extends from the upper surface of the land metal element to the upper surface of the substrate throughout the land metal element.

7. The ball grid array semiconductor package in accordance with claim 5, wherein each hole extends from the upper surface of the land metal element to a depth corresponding to about half the thickness of the land metal element.

8. The ball grid array semiconductor package in accordance with claim 1, wherein each land metal element is plated with a nickel film and a gold film.

* * * * *